United States Patent
Welbon et al.

(10) Patent No.: US 7,080,305 B2
(45) Date of Patent: Jul. 18, 2006

(54) SYSTEM AND METHOD FOR CORRECTING DATA ERRORS

(75) Inventors: Edward Hugh Welbon, Austin, TX (US); Mary Ellen Mosher, Austin, TX (US); Roy Stuart Moore, Georgetown, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 489 days.

(21) Appl. No.: 10/327,729

(22) Filed: Dec. 23, 2002

(65) Prior Publication Data

US 2004/0123213 A1 Jun. 24, 2004

(51) Int. Cl.
*H03M 13/05* (2006.01)

(52) U.S. Cl. .................. 714/752; 714/758; 714/746

(58) Field of Classification Search ............. 714/752, 714/758, 746, 761, 776, 785, 799, 800
See application file for complete search history.

(56) References Cited

U.S. PATENT DOCUMENTS

| | | | | |
|---|---|---|---|---|
| 4,359,772 A | | 11/1982 | Patel | |
| 4,979,174 A | * | 12/1990 | Cheng et al. | 714/774 |
| 4,980,888 A | * | 12/1990 | Bruce et al. | 714/718 |
| 5,202,886 A | * | 4/1993 | Rossi et al. | 370/536 |
| 6,469,854 B1 | | 10/2002 | Gill et al. | |
| 6,560,725 B1 | | 5/2003 | Longwell et al. | |
| 6,701,469 B1 | | 3/2004 | Matter et al. | |

* cited by examiner

*Primary Examiner*—Albert Decady
*Assistant Examiner*—Dipakkumar Gandhi
(74) *Attorney, Agent, or Firm*—Meyertons Hood Kevlin Kowert & Goetzel, P.C.; B. Noël Kivlin; Stephen J. Curran (57) ABSTRACT

A system and method for correcting data errors. A system for correcting errors in blocks of data received over a communication medium includes an error history unit coupled to an error correction unit. The error history unit may maintain information associated with each bit position of the blocks of data in which a correctable error has occurred. The error correction unit may perform an error correction on a given block of data using an error correction code capable of correcting at least a single bit error and detecting multiple bit errors. Further, in response to detecting a multiple bit error, the error correction unit may correct subsequent errors in the given block of data dependent upon the information maintained by the error history unit.

26 Claims, 4 Drawing Sheets

| Error History | | |
|---|---|---|
| Bit Position | Error Occurences | Selected |
| 0 | 0 | 0 |
| 1 | 0 | 0 |
| 2 | 0 | 0 |
| 3 | 18 | 0 |
| 4 | 0 | 0 |
| 5 | 0 | 0 |
| 6 | 0 | 0 |
| 7 | 0 | 0 |
| 8 | 0 | 0 |
| 9 | 2 | 0 |
| 10 | 0 | 0 |
| 11 | 0 | 0 |
| 12 | 0 | 0 |
| 13 | 0 | 0 |
| 14 | 0 | 0 |
| 15 | 0 | 0 |
| 16 | 1 | 0 |
| 17 | 0 | 0 |
| 18 | 0 | 0 |
| 19 | 0 | 0 |
| 20 | 0 | 0 |
| 21 | 0 | 0 |
| 22 | 0 | 0 |
| 23 | 3 | 0 |
| 24 | 0 | 0 |
| 25 | 0 | 0 |
| 26 | 0 | 0 |
| 27 | 1 | 0 |
| . | . | . |
| . | . | . |
| . | . | . |
| 63 | 0 | 0 |
| 64 | 0 | 0 |
| 65 | 0 | 0 |
| 66 | 45 | 0 |
| 67 | 0 | 0 |
| 68 | 0 | 0 |
| 69 | 0 | 0 |
| 70 | 1 | 0 |

| Error History | | | |
|---|---|---|---|
| Bit Position | Error Occurances | Selected | Rank |
| 0 | 0 | 0 | 0 |
| 1 | 0 | 0 | 0 |
| 2 | 0 | 0 | 0 |
| 3 | 18 | 0 | 1 |
| 4 | 0 | 0 | 0 |
| 5 | 0 | 0 | 0 |
| 6 | 0 | 0 | 0 |
| 7 | 0 | 0 | 0 |
| 8 | 0 | 0 | 0 |
| 9 | 2 | 0 | 0 |
| 10 | 0 | 0 | 0 |
| 11 | 0 | 0 | 0 |
| 12 | 0 | 0 | 0 |
| 13 | 0 | 0 | 0 |
| 14 | 0 | 0 | 0 |
| 15 | 0 | 0 | 0 |
| 16 | 1 | 0 | 0 |
| 17 | 0 | 0 | 0 |
| 18 | 0 | 0 | 0 |
| 19 | 0 | 0 | 0 |
| 20 | 0 | 0 | 0 |
| 21 | 0 | 0 | 0 |
| 22 | 0 | 0 | 0 |
| 23 | 3 | 0 | 2 |
| 24 | 0 | 0 | 0 |
| 25 | 0 | 0 | 0 |
| 26 | 0 | 0 | 0 |
| 27 | 1 | 0 | 0 |
| . | . | . | . |
| . | . | . | . |
| . | . | . | . |
| 63 | 0 | 0 | 0 |
| 64 | 0 | 0 | 0 |
| 65 | 0 | 0 | 0 |
| 66 | 45 | 0 | 3 |
| 67 | 0 | 0 | 0 |
| 68 | 0 | 0 | 0 |
| 69 | 0 | 0 | 0 |
| 70 | 1 | 0 | 0 |

FIG. 4

SYSTEM AND METHOD FOR CORRECTING DATA ERRORS

BACKGROUND OF THE INVENTION

1. Field of the Invention

This invention relates to error detection and correction and, more particularly, to detecting and correcting errors in systems processing data.

2. Description of the Related Art

Error codes are commonly used in electronic systems to detect and correct data errors, such as transmission errors or storage errors. For example, error codes may be used to detect and correct errors in data transmitted via any transmission medium (e.g. conductors and/or transmitting devices between chips in an electronic system, a network connect, a telephone line, a radio transmitter, etc.). Error codes may additionally be used to detect and correct errors associated with data stored in the memory of computer systems. One common use of error codes is to detect and correct errors of data transmitted on a data bus of a computer system. In such systems, error correction bits, or check bits, may be generated for the data prior to its transfer or storage. When the data is received or retrieved, the check bits may be used to detect and correct errors within the data.

Component failures are a common source of error in electrical systems. Faulty components may include faulty memory chips or faulty data paths provided between devices of a system. Faulty data paths can result from, for example, faulty pins, faulty data traces, or faulty wires. Additionally, memory modules, which may contain multiple memory chips, may fail. Circuitry which drives the data paths may also fail.

Another source of error in electrical systems may be so-called "soft" or "transient errors." Transient communication errors may occur due to noise on the data paths, inaccurate sampling of the data due to clock drift, etc. On the other hand, "hard" or "persistent" errors may occur due to component failure.

Generally, various error detection code (EDC) and error correction code (ECC) schemes are used to detect and correct memory and/or communication errors. For example, parity may be used. With parity, a single parity bit is stored/transmitted for a given set of data bits, representing whether the number of binary ones in the data bits is even or odd. The parity is generated when the set of data bits is stored/transmitted and is checked when the set of data bits is accessed/received. If the parity doesn't match the accessed set of data bits, then an error is detected.

Other EDC/ECC schemes may assign several check bits per set of data bits. The check bits are encoded from various overlapping combinations of the corresponding data bits. The encodings are selected such that a bit error or errors may be detected, and in some cases the encodings may be selected such that the bit or bits in error may be identifiable so that the error can be corrected (depending on the number of bits in error and the ECC scheme being used). For example, a commonly used EDC/ECC code is a single error correcting/double error detecting (SEC/DED) code, which as the name implies may detect two errors and correct one error. For example, Hamming codes are one commonly used error code. The check bits in a Hamming code are parity bits for portions of the data bits. Each check bit provides the parity for a unique subset of the data bits. If one data bit changes state, this data bit will modify one or more check bits. Because each data bit contributes to a unique group of check bits, the check bits that are modified will identify the data bit that changed state. The error may be corrected by inverting the bit identified to be erroneous.

When using error codes such as a Hamming code, as the number of bit errors that may be detected and/or corrected increases, the number of check bits used in the scheme increases as well. Generally speaking, the number of check bits must be large enough such that $2^{k-1}$ is greater than or equal to n, where k is the number of check bits and n is the number of data bits plus the number of check bits. Accordingly, seven check bits are required to implement a single error correcting Hamming code for 64 bits.

However, although increasing the number of check bits may increase the number of errors which are detectable and/or correctable, there may be drawbacks to this approach. For example, increasing the number of check bits may increase the amount of data handled by the system, which increases the number of memory components, data traces and other circuitry necessary to handle the increased data. Further, the increased number of bits increases the probability of an error. Thus, it may be desirable to increase the error correcting capability of a system without increasing the number of check bits of the error correcting code.

SUMMARY OF THE INVENTION

Various embodiments of a system and method for correcting data errors are disclosed. In one embodiment, a system for correcting errors in blocks of data received over a communication medium includes an error history unit coupled to an error correction unit. The error history unit may be configured to maintain information associated with each bit position of the blocks of data in which a correctable error has occurred. The error correction unit may be configured to perform an error correction on a given block of data using an error correction code capable of correcting at least a single bit error and detecting multiple bit errors. Further, in response to detecting a multiple bit error, the error correction unit may be configured to correct subsequent errors in the given block of data dependent upon the information maintained by the error history unit.

For example, in one specific implementation, the error history unit may include a plurality of entries each corresponding to a respective bit position of the blocks of data. The error history unit may be configured to track a frequency of occurrence of correctable errors in each of the plurality of entries. The error correction unit may be configured to select one or more of the entries having a greater frequency of occurrence of correctable errors than others of the entries which have not been selected for correcting the given block of data. The error correction unit may be further configured to complement one or more bits of the given block of data corresponding to the selected entries and to perform subsequent error correction on the given block of data.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 1:
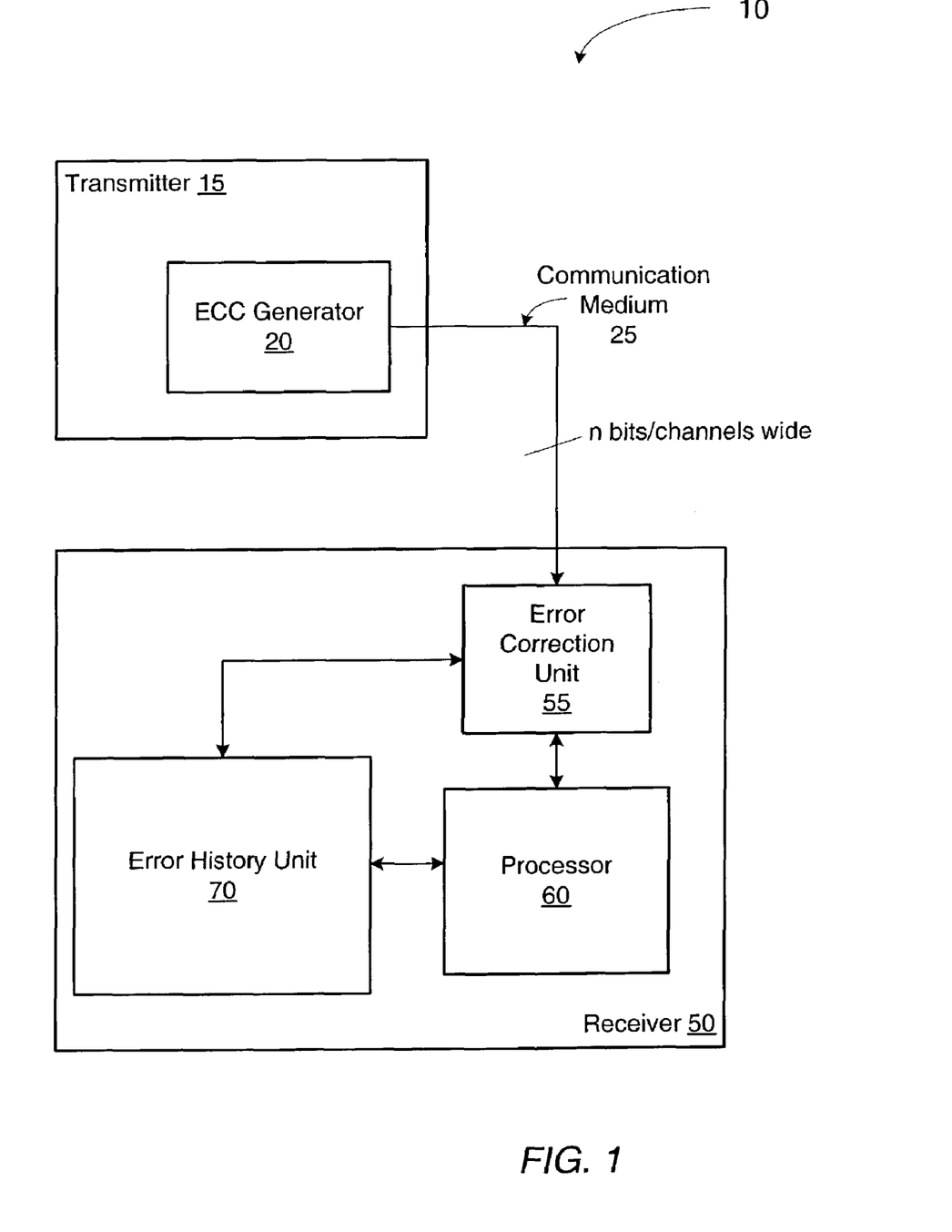
FIG. 1 is a block diagram of one embodiment of a system for correcting errors in blocks of data received over a communication medium.

Turning now to FIG. 1, a block diagram of one embodiment of a system for correcting errors in blocks of data received over a communication medium is shown. The system 10 includes a transmitter 15 coupled to a receiver 50 via a communication medium 25. Communication medium 25 includes n bits/communication channels, where n may be any number of bits. Transmitter 15 includes an error correcting code (ECC) generator. Receiver 50 includes an error correction unit 55 which is coupled to a processor 60. Receiver 50 further includes an error history unit which is coupled to error correction unit 55 and to processor 60. As used herein, an error correcting code may be used to both detect and correct errors.

In one embodiment, transmitter 15 may be configured to send blocks of data containing a plurality of data bits. Prior to sending each block of data, ECC generator 20 may generate an ECC check word including a plurality of check bits which correspond to and protect the block of data. The check bits are typically generated by performing an Exclusive-OR (XOR) operation on a predetermined subset of the data bits to form one check bit. The ECC check word may be sent along with each corresponding data block, thereby forming what is commonly referred to as an ECC word. In one embodiment, the strength of the ECC check word may be such that it is capable of correcting at least a single bit error and detecting multiple bit errors. This type of code is commonly referred to as a single error correcting/double error detecting code (SEC/DED).

Receiver 50 may be configured to receive and process each ECC word. Upon receiving a given ECC word, error correction unit 55 may be configured to validate the received ECC word by performing an error correction sequence including a decoding of the ECC word. In one embodiment, an error correction sequence may include regenerating the ECC check word using the received data bits of the data block. Error correction unit 55 may XOR each check bit of the regenerated ECC check word with each corresponding check bit of the received ECC check word. This XOR-ing process generates a set of syndrome bits which correspond to the check bits. If the syndrome bits are all zero, no errors are detected and the block of data may be further processed by receiver 50. However, if there is a single bit error in the received ECC word, one syndrome bit may not be zero identifying the bit position containing the error. A single bit error may be corrected by error correction unit 55 inverting or complementing the erroneous bit. In addition, error correction unit 55 may notify error history unit 70 that a correctable error has occurred.

As described further below, if a multi-bit error is detected, error correction unit 55 may not immediately correct the subsequent errors. Instead, error correction unit 55 may notify error history unit 70 of the presence of a multi-bit error. Error history unit 70 may respond to error correction unit 55 with information which may enable error correction unit 55 to correct the subsequent errors.

In response to detecting a multiple bit error, error correction unit 55 may be configured to notify error history unit 70. In response to the notification, error history unit 70 may select and provide one or more bit positions to error correction unit 55. The bit positions may be selected using error correlation information corresponding to an error history maintained over some period of time. For example, error history unit 70 may track the frequency of errors occurring on each channel of communication medium 25. When a multiple bit error is detected, error history unit 70 may make a prediction of which bit or bits are most likely to have caused the multiple bit error based upon the frequency of correctable errors occurring on each bit/channel. Thus, bits having a higher number of occurrences of correctable errors may have a higher likelihood of causing a multiple bit error.

In one embodiment, error history unit 70 may maintain information associated with each bit position or channel of communication medium 25. Each time error history unit 70 is notified that a correctable error has occurred, error history unit 70 may be configured to store information associated with which bit position in the received block of data the error occurred. In one embodiment, a counter value may be used to track the frequency of correctable errors; for every error occurrence, the counter value may be incremented.

In addition, in one embodiment, error history unit 70 may apply a weighting factor to each bit position dependent upon such factors as the rate of change of the occurrence of errors over a predetermined time interval. The weighting factor may be used in ranking each of the bit positions with a rank value. In one embodiment, error history unit 70 may use the rank value when selecting which bit position(s) to provide to error correction unit 55, thereby allowing error history unit 70 to adapt to changing conditions. For example, assume bit position 2 has an error occurrence count of 10, but hasn't had an error in a long time. Further, assume that bit position 5 has an error occurrence count of 5, but the errors have occurred in the last few minutes. Error history unit 70 may apply a more significant weighting factor to bit position 5, thereby giving it a higher rank value. It is noted that in one embodiment, error history unit 70 may perform post-processing of the information such as applying the weighting functions and updating rank values between blocks of data and during other non-critical times.

In one embodiment, error history unit 70 may be configured to deterministically predict the number of bit positions which may be in error for each block of data. For example, error history unit 70 may predict that the multiple bit error is a two-bit error and may thus select one bit position to return to error correction unit 55 in response to a multiple bit error notification. However, depending upon such factors as the overall frequency of correctable errors being reported by error correction unit 55 in a given time interval, error history unit 70 may select and return other numbers of bit positions.

Error history unit 70 may identify and select the bit position(s) having the greatest frequency of error occurrences and then provide the bit position(s) to error correction unit 55. The bit position(s) having the greatest frequency of errors may have the highest count value or alternatively may have the highest rank value. In response to receiving the bit position(s), error correction unit 55 may complement the data bit(s) of the received block of data occupying the identified bit position(s). Error correction unit 55 may then perform an error correction on the received data block by regenerating the ECC check word and comparing it to the received ECC check word. If the error correction results in detection of a single bit error, error correction unit 55 may correct the single bit error and notify error history unit 70 of the correctable error. Error history unit 70 may increment the counter value of the bit position(s) associated with the multiple-bit error. As will be described in greater detail below in conjunction with the description of FIG. 3, if a single bit error is not detected after complementing one or more bits, error correction unit 55 may return any complemented bit to the original value. Error correction unit 55 and error history unit 70 may iteratively select different bit positions and perform subsequent error corrections until either a single bit error is detected and corrected or all bit positions have been selected and a multiple bit error is still detected.

In one embodiment, processor 60 may execute instructions to process the received blocks of data and to manipulate the information maintained by error history unit 70. It is noted that processor 60 may be an example of any general-purpose processor such as a microprocessor in the UltraSparc™ family of microprocessors, for example.

In one embodiment, error history unit 70 may be a table or other data structure implemented in software and stored in a memory unit (not shown). For example, processor 60 may execute program instructions which implement error history unit 70. In an alternative embodiment, error history unit 70 may be implemented entirely in hardware. For example, error history unit 70 may be implemented as a cache memory including a mechanism such as a content addressable memory (CAM), for accessing the information stored within error history unit 70. In another alternative embodiment, error history unit 70 may be implemented as a combination of software and hardware.

Figure 2:
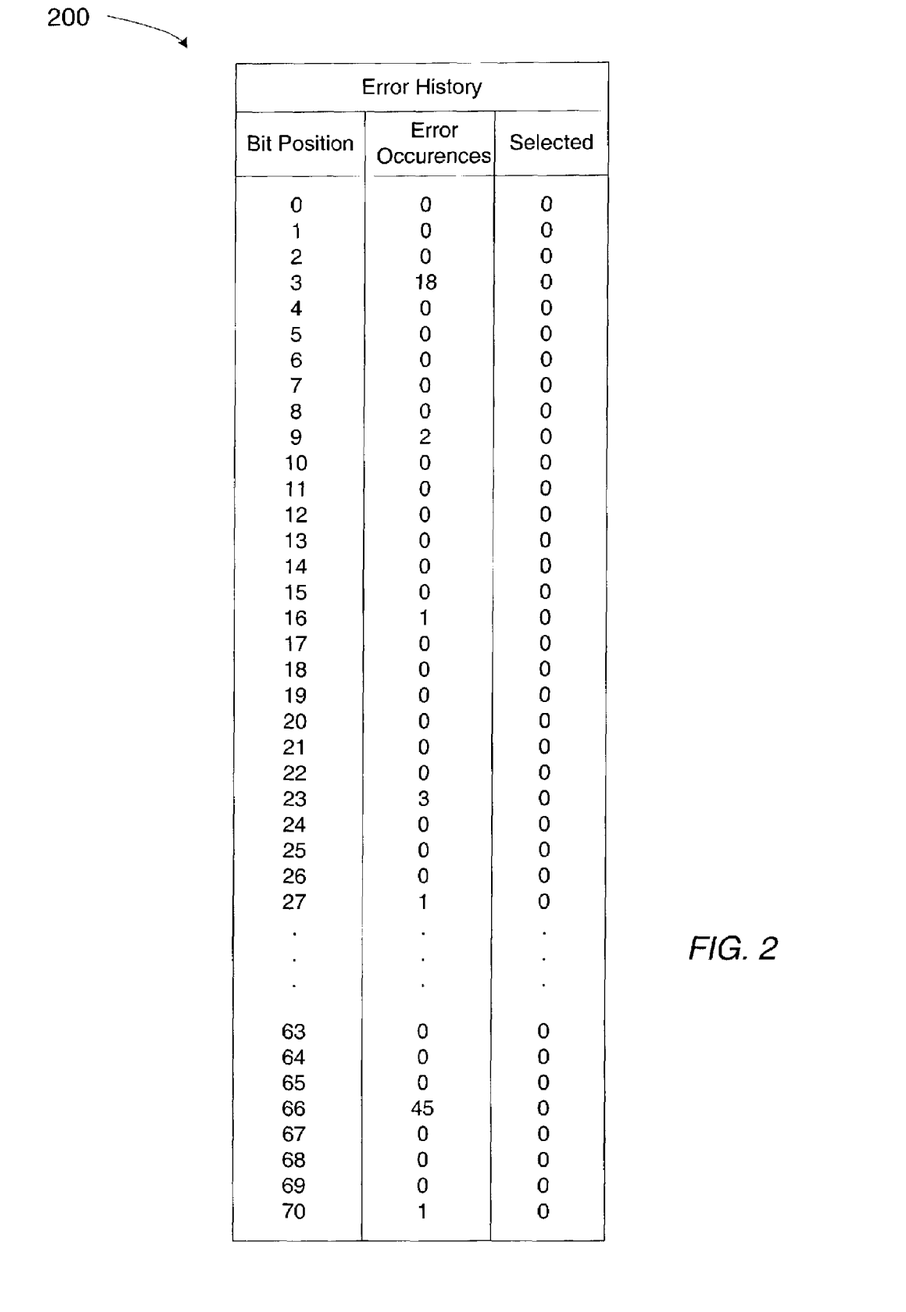
FIG. 2 is a diagram illustrating one embodiment of an error history table maintained by one embodiment of an error history unit.

Referring to FIG. 2, a diagram illustrating one embodiment of an error history table maintained by one embodiment of an error history unit is shown. Error history table 200 includes three columns, designated Bit Position, Error Occurrences and Selected. Error history table 200 includes a plurality of entries. Each entry corresponds to a bit position of a block of data or a channel associated with a communication medium.

In the illustrated embodiment, there are 71 bit positions, designated 0–70. Each bit position corresponds to one bit of a 71-bit block of data including seven ECC check bits. It is contemplated that other embodiments may employ any number of data bits and check bits which may be represented in error history table 200. The Error Occurrences column is used to track the number of correctable errors which have occurred for each bit position. In one embodiment, each time a single bit error is corrected, the Error Occurrences column of the bit position corresponding to the error is incremented. The Selected column is used to track whether a given bit position has been selected during a multiple bit error correction sequence for a given block of data. In one embodiment, if a given bit position is selected as a probable error bit in a multiple bit error, the Selected column of the given bit is set. In other embodiments, the Selected column of the given bit may be cleared to indicate that the given bit position has been selected. Further, once a single bit error is corrected for a given block of data or all bit positions have been selected, the Selected column may be reset to indicate that no bit positions have been selected.

In the illustrated embodiment, bit position 3 has an error occurrence count of 18. In addition, bit position 9 has an error occurrence count of 2. Further, bit position 66 has an error occurrence count of 45. It is noted that these counts are for illustrative purposes only. As will be described in greater detail below in conjunction with FIG. 3, bit position 66 may be selected first during a multiple bit error correction.

It is noted that in an alternative embodiment, error history table 200 may only include entries corresponding to bit positions in which an error has occurred. In such an embodiment, in response to the first occurrence of an error on a given bit position, a corresponding entry may be added to error history table 200 and the Error Occurrence count may be incremented.

Figure 3:
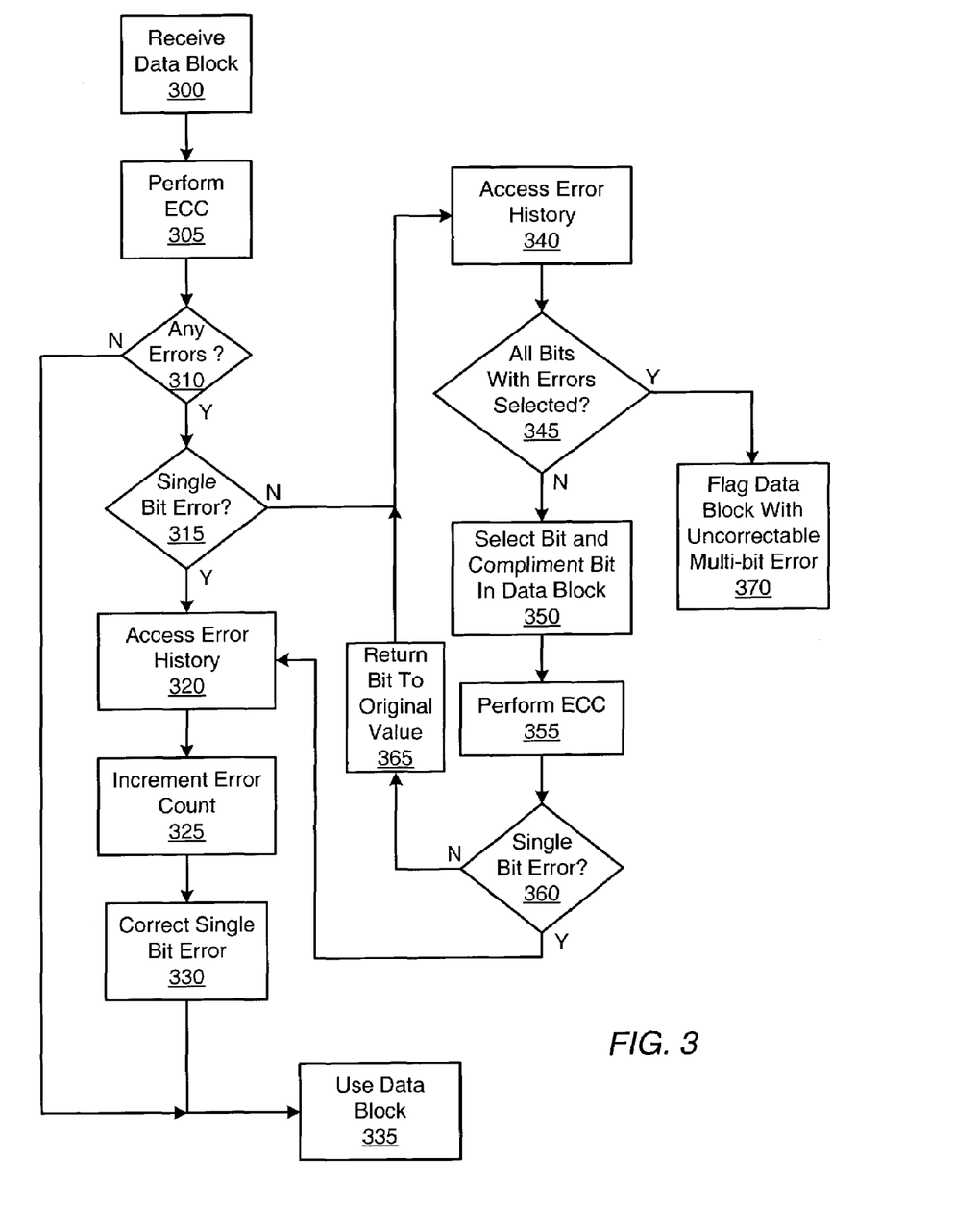
FIG. 3 is a flow diagram describing operation of one embodiment of the system of FIG. 1.

Turning now to FIG. 3, a flow diagram describing operation of one embodiment of the system of FIG. 1 is shown. Receiver 50 of FIG. 1 may perform an iterative error correction sequence until either a single bit error is detected and corrected or all bit positions have been selected and no single bit error is corrected. Receiver 50 receives a block of data including a plurality of ECC check bits capable of detecting and correcting at least a single bit error and detecting a multiple bit error in the block of data (block 300). Error correction unit 55 performs an error correction on the block of data by regenerating the ECC check bits from the received data bits and XORing them with the received ECC check bits (block 305). If the resulting syndrome bits are all zero, no errors are detected (block 310) and error correction unit 55 may provide the block of data to processor 60 for further processing (block 335).

However, if one or more errors are detected (block 310) and the error is a single bit error (block 315), error correction unit 55 notifies error history unit 70 of the correctable error and provides the bit position having the error (320). Error history unit 70 may access the error history (block 320) and may increment the error occurrence count by one (block 325). Error correction unit 55 may correct the single bit error (block 330) and provide the block of data to processor 60 for further processing (block 335). It is noted that in one embodiment, error correction unit 55 may correct the error before notifying error history unit 70 such that error history unit 70 may perform history maintenance activities while the corrected data block is being processed.

Referring back to block 315, if a multiple bit error is detected, error correction unit 55 may notify error history unit 70 of the multiple bit error. Error history unit 70 may access the error history table (block 340). Error history unit 70 may check the Selected column to ensure that there are bit positions which have not been selected during correction of the current block of data (block 345). If there are no bit positions which have not been selected during correction of the current block of data, error history unit 70 may notify error correction unit 55 and the block of data may be flagged as having an uncorrectable error (block 370).

If there are bit positions which have not been selected during correction of the current block of data, error history unit 70 may select the bit position having the greatest error occurrence count with respect to all other entries which have not been selected to correct the current block of data. For example, position 66 of error history table 200 of FIG. 2 shows has 45 error occurrences and would thus be selected first in this example. In addition, error history unit 70 may set the selected bit for bit position 66 and provide the bit position to error correction unit 55. Error correction unit 55 may complement the bit of the block of data occupying the selected bit position (block 350). Error correction unit 55 may perform a subsequent error correction on the block of data as described above in conjunction with the description of FIG. 1 (block 355).

If a single bit error is now detected (block 360), error correction unit 55 notifies error history unit 70 of the correctable error and provides the bit position having the error (320). Error history unit 70 may access the error history table (block 320) and may increment the error occurrence count by one (block 325). Error correction unit 55 may correct the single bit error (block 330) and provide the block of data to processor 60 for further processing (block 335). It is noted that in one embodiment, error correction unit 55 may correct the error before notifying error history unit 70 such that error history unit 70 may perform history maintenance activities while the corrected data block is being processed.

Referring back to block 360, if error correction unit 55 continues to detect a multiple bit error, error correction unit 55 may return the complemented bit back to the original value (i.e., the bit value prior to being complimented) (block 365).

As described above, the error correction sequence on a given block of data may continue iteratively back to block 340, where another bit position (e.g., bit position 3) may be selected if it has not been previously selected. The bit corresponding to the selected bit position may be complemented and a subsequent error correction may be performed. The sequence may continue until either a single bit error is detected and corrected or all bit positions have been selected and no single bit error is corrected.

As described in greater detail below in conjunction with the description of FIG. 4, error history unit 70 may maintain a ranking of the bit positions relative to each other. In one embodiment, a bit position's rank value may be the result of using a weighting factor based on a shift in the error occurrence patterns of the bit positions observed in a particular time interval. Further, in another embodiment, a bit position's rank value may be the result of using deterministic selection approach based upon the probability that the detected error may include more than two errors. In such an embodiment, more than one bit position may have the same rank. Accordingly, in either embodiment, the rank value may be used as the determining factor when selecting bit positions during subsequent error corrections of a given block of data.

Figure 4:
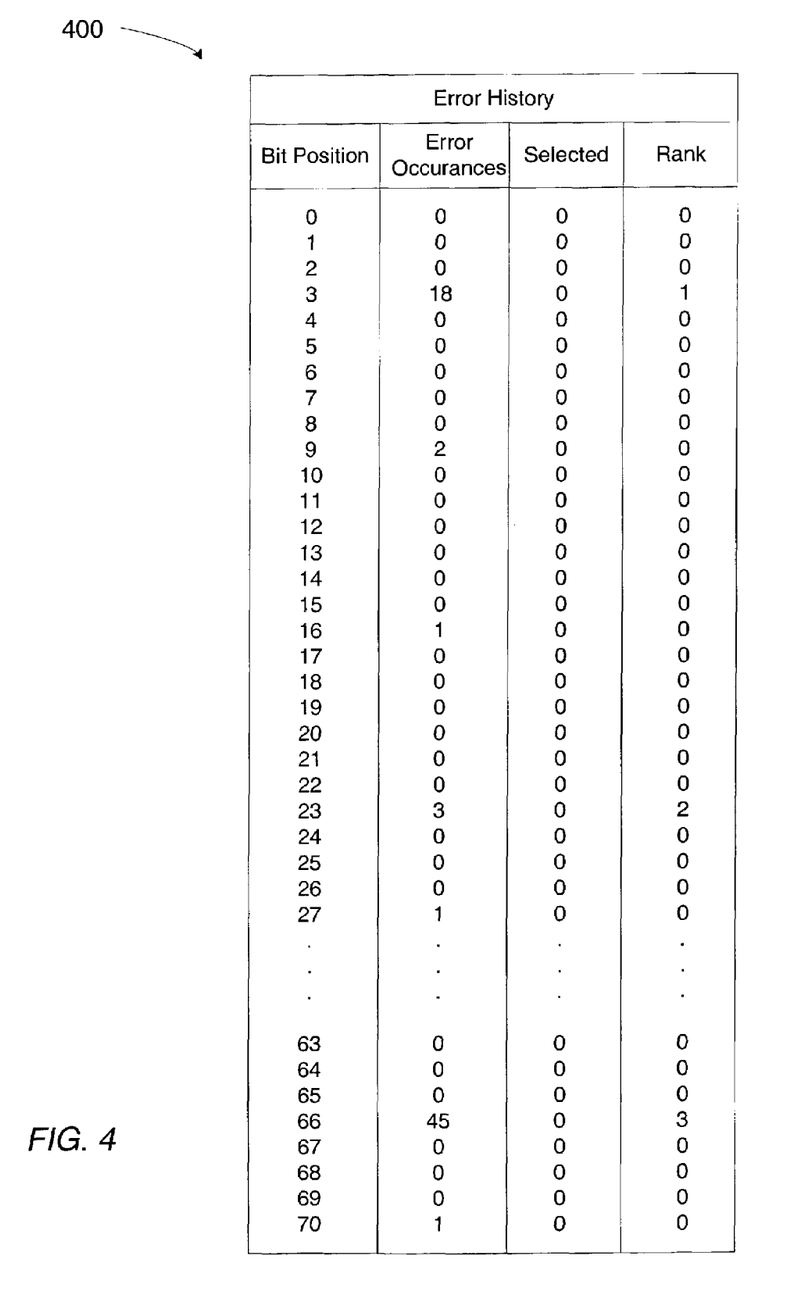
FIG. 4 is a diagram illustrating another embodiment of an error history table maintained by another embodiment of an error history unit.

Referring to FIG. 4, a diagram illustrating another embodiment of an error history table maintained by one embodiment of an error history unit is shown. Error history table 400 includes four columns, designated Bit Position, Error Occurrences, Selected and Rank. Error history table 400 includes a plurality of entries. Each entry corresponds to a bit position of a block of data or a channel associated with a communication medium.

Similar to the embodiment described in FIG. 2, the illustrated embodiment of FIG. 4 includes 71 bit positions, designated 0–70. Each bit position corresponds to one bit of a 71-bit block of data including seven ECC check bits. It is contemplated that other embodiments may employ any number of data bits and check bits which may be represented in error history table 200. The Error Occurrences column is used to track the number of correctable errors which have occurred for each bit position. In one embodiment, each time a single bit error is corrected, the Error Occurrences column of the bit position corresponding to the error is incremented. The Selected column is used to track whether a given bit position has been selected during a multiple bit error correction sequence for a given block of data. In one embodiment, if a given bit position is selected as a probable error bit in a multiple bit error, the Selected column of the given bit is set. In other embodiments, the Selected column of the given bit may be cleared to indicate that the given bit position has been selected. Further, once a single bit error is corrected for a given block of data or all bit positions have been selected, the Selected column may be reset to indicate that no bit positions have been selected. The Rank column is used to reflect the selection order of the bit positions.

In the illustrated embodiment, bit position 3 has a rank of 1, while bit position 66 has a rank of 3 even though the error occurrences count is higher. Thus, bit position 3 may be selected first to correct a multiple bit error. The rank values shown in FIG. 4 may be indicative that the errors occurring in bit position 3 may be "newer" errors than those of any other bit position. Thus, a weighting factor may have been applied during calculation of the rank values.

It is noted that the nature of error history table 400 may enable a variety of calculations to be performed to determine an appropriate rank value. For example, the smoothing or averaging algorithms may be performed to predict the most likely failing bit or bits. In addition, tracking the errors against time may allow for an adaptable and dynamic error correction mechanism.

It is noted that in an alternative embodiment, error history table 400 may only include entries corresponding to bit positions in which an error has occurred. In such an embodiment, in response to the first occurrence of an error at a given bit position, a corresponding entry may be added to error history table 400 and the Error Occurrence count may be incremented.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for correcting errors in blocks of data received over a communication medium, said system comprising:
    an error history unit configured to maintain information associated with each bit position of said blocks of data in which a correctable error has occurred, wherein said information is indicative of previous occurrences of correctable errors associated with each bit position; and
    an error correction unit coupled to said error history unit and configured to perform an error correction on a given block of data using an error correction code capable of correcting at least a single bit error and detecting multiple bit errors;
    wherein in response to detecting a multiple bit error in said given block of data, said error correction unit is configured to complement at least one bit of said given block of data based on said information, determine if a single bit error is present in said given block of data subsequent to complementing the at least one bit, and correct the single bit error if present.

2. The system as recited in claim 1, wherein said error history unit includes a plurality of entries each corresponding to a respective bit position of said blocks of data.

3. The system as recited in claim 2, wherein said error history unit is configured to track an occurrence count indicating a number of previous occurrences of correctable errors in each of said plurality of entries.

4. The system as recited in claim 3, wherein said error correction unit is configured to select one or more of said plurality of entries having a greater occurrence count than others of said plurality of entries which have not been selected for correcting said given block of data.

5. The system as recited in claim 4, wherein said error correction unit is further configured to complement one or more bits of said given block of data corresponding to said selected entries and to perform subsequent error correction on said given block of data.

6. The system as recited in claim 5, wherein in response to detecting a multiple bit error during said subsequent error correction, said error correction unit is configured to return said one or more complemented bits of said given block of data to their respective original values.

7. The system as recited in claim 6, wherein in response to detecting said multiple bit error during performance of said subsequent error correction, said error correction unit is configured to select one or more additional entries of said plurality of entries having a greater occurrence count than others of said plurality of entries which have not been selected to correct said given block of data and to perform a second subsequent error correction.

8. The system as recited in claim 6, wherein, in response to detecting said multiple bit error during performance of any subsequent error correction, said error correction unit is configured to iteratively select one or more additional entries having a greater occurrence count than others of said plurality of entries which have not been selected to correct said given block of data, to complement one or more bits of said given block of data corresponding to said selected entries and to perform further subsequent error corrections until either a single bit error is corrected or all entries have been selected to correct said given block of data.

9. The system as recited in claim 3 further comprising a processor coupled to said error history unit and configured to calculate a rank value based upon a rate of change of said occurrence count over a predetermined interval of time and to assign said rank value to each of said plurality of entries.

10. The system as recited in claim 9, wherein said error correction unit is further configured to select one or more of said plurality of entries having a rank value greater than others of said plurality of entries which have not been selected to correct said given block of data.

11. The system as recited in claim 10, wherein said error correction unit is further configured to complement one or more bits of said given block of data corresponding to said selected entries and to perform subsequent error correction on said given block of data.

12. The system as recited in claim 11, wherein in response to detecting a multiple bit error during said subsequent error correction, said error correction unit is configured to return said one or more complemented bits of said given block of data to their respective original values.

13. The system as recited in claim 12, wherein in response to detecting said multiple bit error during performance of any subsequent error correction, said error correction unit is configured to iteratively select one or more additional entries having a rank value greater than others of said plurality of entries which have not been selected to correct said given block of data, to complement one or more bits of said given block of data corresponding to said selected entries and to perform further subsequent error corrections until either a single bit error is corrected or all entries have been selected to correct said given block of data.

14. A method for correcting errors in blocks of data received over a communication medium, said method comprising:
    maintaining information associated with each bit position of said blocks of data in which a correctable error has occurred, wherein said information is indicative of previous occurrences of correctable errors associated with each bit position;
    performing an error correction on a given block of data using an error correction code capable of correcting at least a single bit error and detecting multiple bit errors;
    complementing at least one bit of said given block of data based on said information in response to detecting a multiple bit error in said given block of data;
    determining if a single bit error is present in said given block of data subsequent to complementing; and
    correcting the single-bit error if present in said given block of data.

15. The method as recited in claim 14, wherein said information includes a plurality of entries each corresponding to a respective bit position of said blocks of data.

16. The method as recited in claim 15 further comprising maintaining a an occurrence count indicating a number of previous occurrences of correctable errors in each of said plurality of entries.

17. The method as recited in claim 16 further comprising selecting one or more of said plurality of entries having a greater occurrence count than others of said plurality of entries which have not been selected for correcting said given block of data.

18. The method as recited in claim 17 further comprising complementing one or more bits of said given block of data corresponding to said selected entries and to perform subsequent error correction on said given block of data.

19. The method as recited in claim 18, wherein in response to detecting a multiple bit error during said subsequent error correction, returning said one or more complemented bits of said given block of data to their respective original values.

20. The method as recited in claim 19, wherein in response to detecting said multiple bit error during performance of said subsequent error correction, selecting one or more additional entries of said plurality of entries having a greater occurrence count than others of said plurality of entries which have not been selected to correct said given block of data and to perform a second subsequent error correction.

21. The method as recited in claim 19, wherein in response to detecting said multiple bit error during performance of any subsequent error correction, iteratively selecting one or more additional entries having a greater occurrence count than others of said plurality of entries which have not been selected to correct said given block of data, complementing one or more bits of said given block of data corresponding to said selected entries and performing further subsequent error corrections until either a single bit error is corrected or all entries have been selected to correct said given block of data.

22. The method as recited in claim 16 further comprising calculating a rank value based upon a rate of change of said occurrence count over a predetermined interval of time and assigning said rank value to each of said plurality of entries.

23. The method as recited in claim 22 further comprising selecting one or more of said plurality of entries having a rank value greater than others of said plurality of entries which have not been selected to correct said given block of data.

24. The method as recited in claim 23 further comprising complementing one or more bits of said given block of data corresponding to said selected entries and to perform subsequent error correction on said given block of data.

25. The method as recited in claim 24, wherein in response to detecting a multiple bit error during said subsequent error correction, returning said one or more complemented bits of said given block of data to their respective original values.

26. The method as recited in claim 25, wherein in response to detecting said multiple bit error during performance of any subsequent error correction, iteratively selecting one or more additional entries having a rank value greater than others of said plurality of entries which have not been selected to correct said given block of data, complementing one or more bits of said given block of data corresponding to said selected entries and performing further subsequent error corrections until either a single bit error is corrected or all entries have been selected to correct said given block of data.

* * * * *